(12) United States Patent
Lee

(10) Patent No.: US 7,047,628 B2
(45) Date of Patent: May 23, 2006

(54) IMPEDANCE MATCHING OF DIFFERENTIAL PAIR SIGNAL TRACES ON PRINTED WIRING BOARDS

(75) Inventor: Michael K. T. Lee, San Jose, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 120 days.

(21) Appl. No.: 10/356,660

(22) Filed: Jan. 31, 2003

(65) Prior Publication Data

US 2004/0150970 A1 Aug. 5, 2004

(51) Int. Cl.
*H05K 3/36* (2006.01)
(52) U.S. Cl. .......................... 29/830; 29/846; 174/261; 428/901
(58) Field of Classification Search .................. 29/830, 29/846, 620, 25.42, 825; 174/261; 428/901
See application file for complete search history.

(56) References Cited

U.S. PATENT DOCUMENTS

| 4,870,746 A | * | 10/1989 | Klaser ......................... 29/620 |
| 5,010,641 A | * | 4/1991 | Sisler .......................... 29/830 |
| 5,191,174 A | * | 3/1993 | Chang et al. ................ 174/266 |
| 5,475,264 A | * | 12/1995 | Sudo et al. .................. 257/723 |
| 5,639,989 A | * | 6/1997 | Higgins, III ........... 174/35 MS |
| 6,384,341 B1 | | 5/2002 | Rothermel et al. ......... 174/255 |
| 6,392,164 B1 | | 5/2002 | Iwaki et al. ................ 174/262 |
| 6,767,252 B1 | | 7/2004 | McGrath et al. ............ 439/637 |
| 6,787,710 B1 | | 9/2004 | Uematsu et al. ............ 174/261 |

FOREIGN PATENT DOCUMENTS

JP 2001053397 A 2/2001

* cited by examiner

*Primary Examiner*—Carl J. Arbes
(74) *Attorney, Agent, or Firm*—Wong, Cabello, Lutsch, Rutherford & Brucculeri, LLP

(57) ABSTRACT

A printed wiring board having differential pair signal traces has increased spacing between signal-carrying vias and ground or power planes and/or is equipped with selectively placed ground vias to enhance the impedance matching of the signal traces.

19 Claims, 6 Drawing Sheets

US 7,047,628 B2

IMPEDANCE MATCHING OF DIFFERENTIAL PAIR SIGNAL TRACES ON PRINTED WIRING BOARDS

BACKGROUND OF THE INVENTION

1. Field of the Invention

This invention relates to printed wiring boards (PWB's) also referred to as printed circuit boards (PCB's) when populated with components. More particularly, it relates to printed wiring boards having differential pair signal traces.

2. Description of the Problem and the Related Art

In digital circuits, it is common to represent a binary "zero" with one voltage level and a binary "one" with another, different voltage level. By way of example, a logical "one" might be represented by a +5 volt signal level and a logical "zero" by 0 volts on a given signal line. Inasmuch as voltages are relative, it is common to reference the signal level to ground. Signals formed in this way are referred to as single-ended signals.

One disadvantage of this scheme is that the noise margin, or level between the guaranteed zero and one levels, is relatively small. It is preferable—i.e., more definite—to have a large noise margin. This is especially true at high frequencies where settling times can be relatively long due to ringing and other high frequency components of fast-rise signals.

The above-described disadvantage can be avoided by the use of differential pair signal transmission means. In this way, the signal state is not referenced from either ground or a high level but is based on the voltage difference between the two signals being above a given level. One representative case is shown in FIG. 1 wherein differential pair AB is comprised of Line A and Line B which may be at 0 or +5 vdc. A logical zero is represented by Line B being high—e.g., about +5 vdc—and line A being low—e.g., about 0 vdc. A logical one is represented by Line A being high and Line B being low. This scheme approximately doubles the noise margin as compared to single-ended cases.

Printed wiring boards (PWB's) or printed circuit boards (PCB's) may have signal lines comprised of traces on the top, bottom and/or interior layers of the board.

Signal wires (traces) on the printed wiring board carry signals between modules and between modules and input/output connections to the wiring board. In some circumstances, it is necessary for the signal lines to be routed on different layers in a PWB. "Vias" or via service terminals (VST's) are used to perform this layer-to-layer connection.

Vias may be "blind" holes which are open to one surface of the wiring board but do not extend to the opposite surface; they may be "buried" holes which connect only internal layers of the board and do not extend to either surface of the printed wiring board; or they may be plated through-holes which extend the full thickness of the board and open to solder pads on both surfaces of the board.

Conventional routing of differential pair signal lines on or within PWB's can result in bandwidth limitations for the signals due to impedance mismatches. This is particularly the case for high speed circuits—for example those running at 1 gigahertz and above. Any source of impedance mismatch becomes of greater concern as frequencies increase because of increased distortion of the waveforms in data transmission lines, resulting in poor eye patterns, jitters, overshoot, ringing, slow rise/fall time, etc. Furthermore, the impedance mismatch increases electromagnetic interference (EMI). Thus, any technique which reduces impedance mismatch for a reasonable cost is desirable.

DETAILED DESCRIPTION OF THE INVENTION

Figure 1:
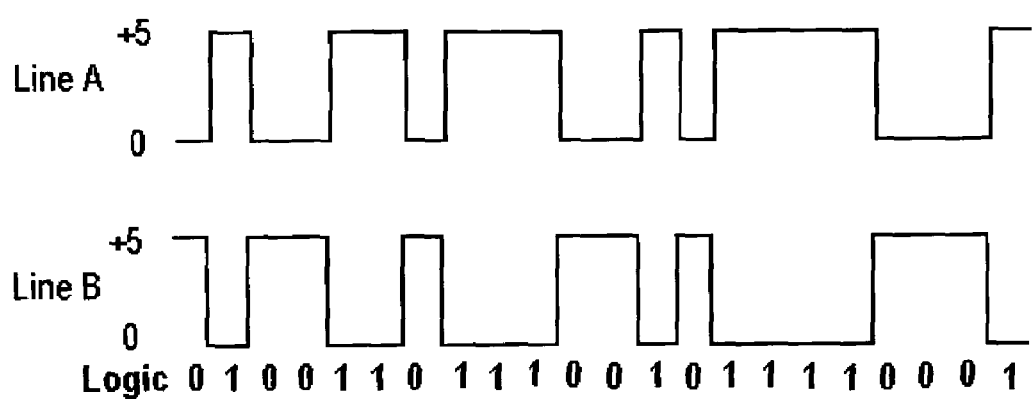
FIG. 1 is an illustration of voltage levels on a differential pair of signal traces.
Figure 2:
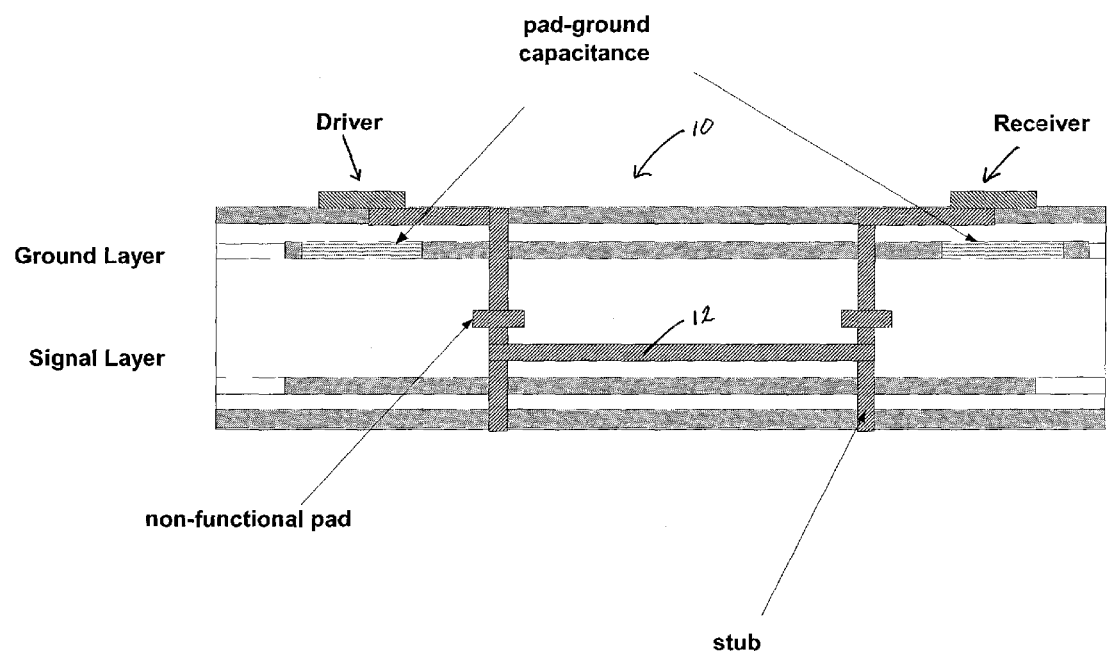
FIG. 2 is cross sectional view of a printed wiring board of the prior art.

A typical, multi-layer printed wiring board 10 with signal layers and ground layers is shown in cross section in FIG. 2 wherein a driver and a receiver are connected by way of signal path 12. Signal wires (traces) on the printed wiring board carry signals between modules and between modules and input/output connections to the circuit board. Also illustrated in FIG. 2 is the phenomenon of pad-to-ground capacitance. Two electrical conductors in proximity to each other will exhibit a capacitance between them. In general, the capacitance will increase with decreasing distance of separation. The impedance of signal traces can be affected by the proximity of such signal traces to ground planes in a printed wiring board. At higher signal frequencies (e.g., greater than about 1 Gigahertz), the capacitance between signal lines and ground may significantly impact the impedance of the signal trace. It will be appreciated that at gigahertz frequencies, power planes in a printed wiring board can produce the same effect—i.e., the capacitance between a signal trace and a power layer in the PWB can adversely affect the impedance of the signal trace. Power planes and ground planes in a PWB may be considered "voltage planes" inasmuch as they are typically maintained at relatively constant potentials.

It has been found that the vias used to transfer differential pair signals between layers of a PWB can be a source of impedance mismatch. It has also been found that the impedance matching of differential pair signals comprised of two signal traces on a PWB which include vias to change routing layers can be improved by increasing the spacing to ground planes and/or providing a special ground via proximate the two vias of the differential pair traces. It is believed that this additional ground via provides a current return path for the signal along the PWB thickness direction and favorably alters the dimensions of the electromagnetic ground plane. The impedance of a line can be measured, for example, by Time Domain Reflectometry (TDR). Thus, the efficacy of the method disclosed herein can be quantified and the placement of one or more ground vias on the PWB may be optimized so as to provide the best possible impedance matching of the differential pair traces.

Figure 3:
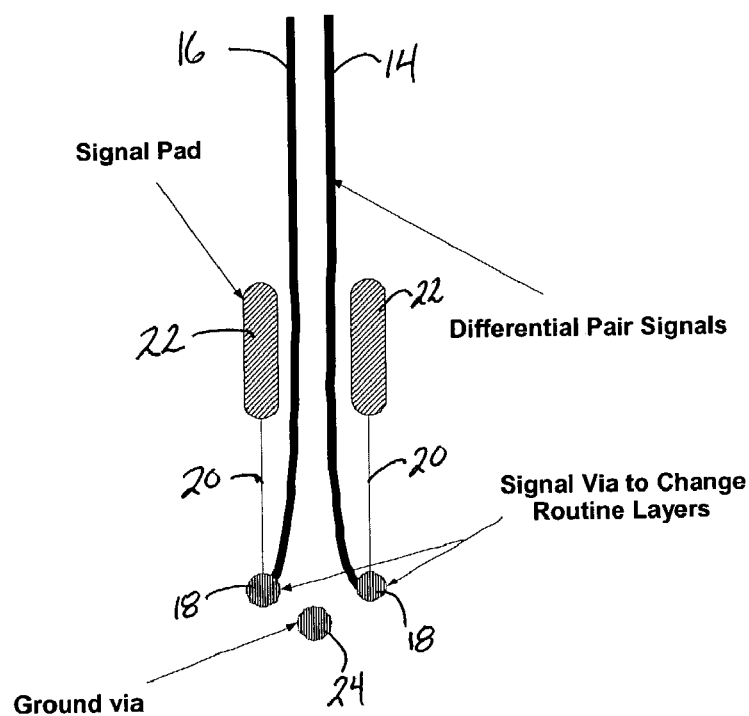
FIG. 3 is a top plan view of selected layers of a printed wiring board having one embodiment of the invention.

FIG. 3 is a top plan view of a multi-layer PWB employing one embodiment of the present invention. The PWB comprises traces 14 and 16 forming a differential pair signal line AB. The differential pair signal lines are shown in partial perspective as they traverse an interior layer of the PWB and electrically connect with signal vias 18 in order to reach an exterior surface of the PWB and connect to signal pads 22 by means of top layer signal traces 20.

Figure 4A:
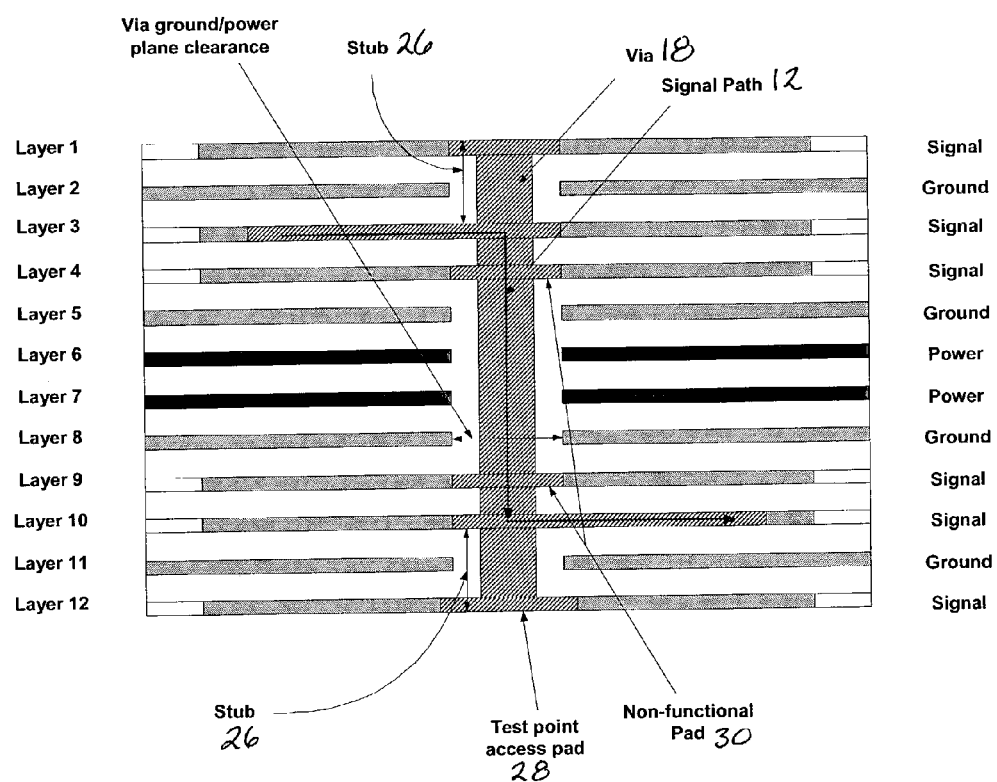
FIG. 4a is a cross sectional view of a printed wiring board of the prior art.

FIG. 4a is a cross-sectional view of a conventional 12-layer printed wiring board in the vicinity of a via 18 which comprises a portion of the signal path 12. Stubs 26 provide electrical continuity to test point access pads 28 which may be contacted by test equipment probes in order to sample the signal. Of particular note are non-functional pads 30 attached to via 18 in certain signal layers of the PWB and the via ground/power plane clearance which is typically about 32 mils. Non-functional pads may be an artifact of the CAD layout library used to produce the PWB which typically incorporate a pad of specific size at signal layers penetrated by a via service terminal.

Figure 4B:
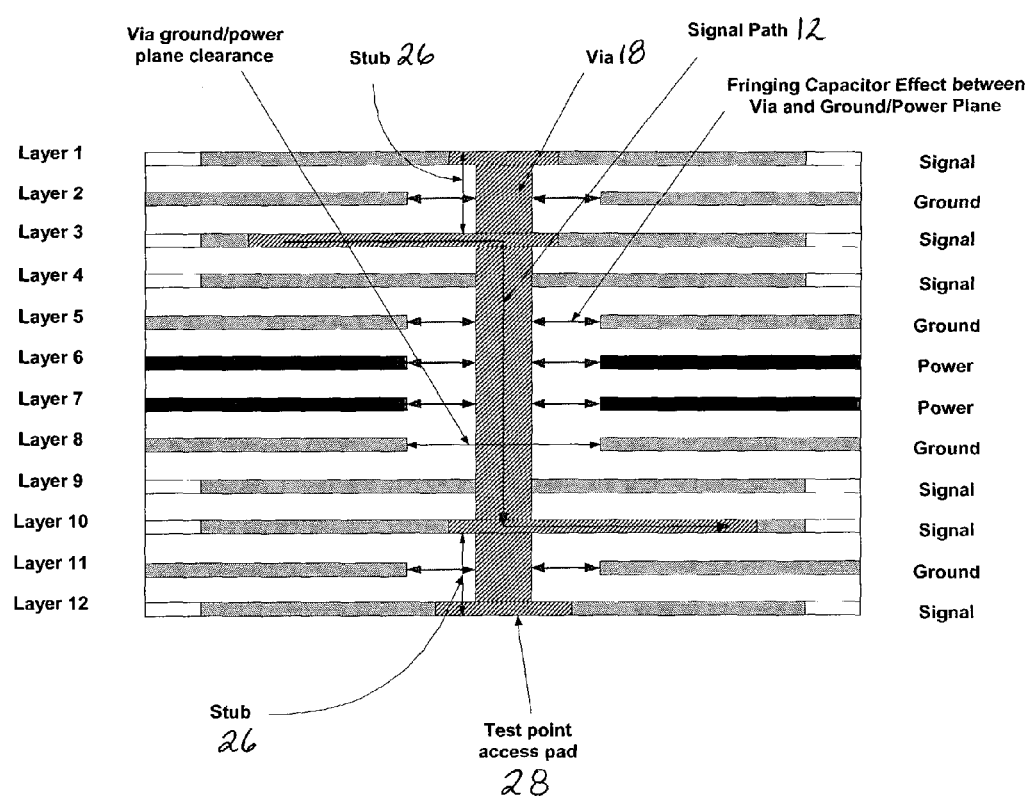
FIG. 4b is a cross sectional view of the same printed wiring board which incorporates one aspect of the present invention.

FIG. 4b is a cross-sectional view of the same PWB as depicted in FIG. 4a which has been modified in accordance with certain aspects of the present invention, namely the elimination of non-functional pads in certain signal layers and an increase in the via ground/power plane clearance to approximately 60 mils. This increased spacing has been found to decrease the trace-to-ground plane capacitance so that no appreciable impedance mismatch occurs at those points.

In some instances it is difficult to match the impedances of a differential pair of signal traces. It is often desired to maintain a 50-ohm impedance in a signal trace. Changing the trace-to-ground plane capacitance by increasing the spacing between signal vias and surrounding ground or power planes can affect the signal impedance. An additional aspect of the present invention is the addition of a ground via to provide some ground reference and to maintain the impedance of the signal trace at about 50 ohms. Such additional ground vias may not be necessary in those cases where the two lines of a differential pair signal trace are nearly perfectly matched.

Figure 5:
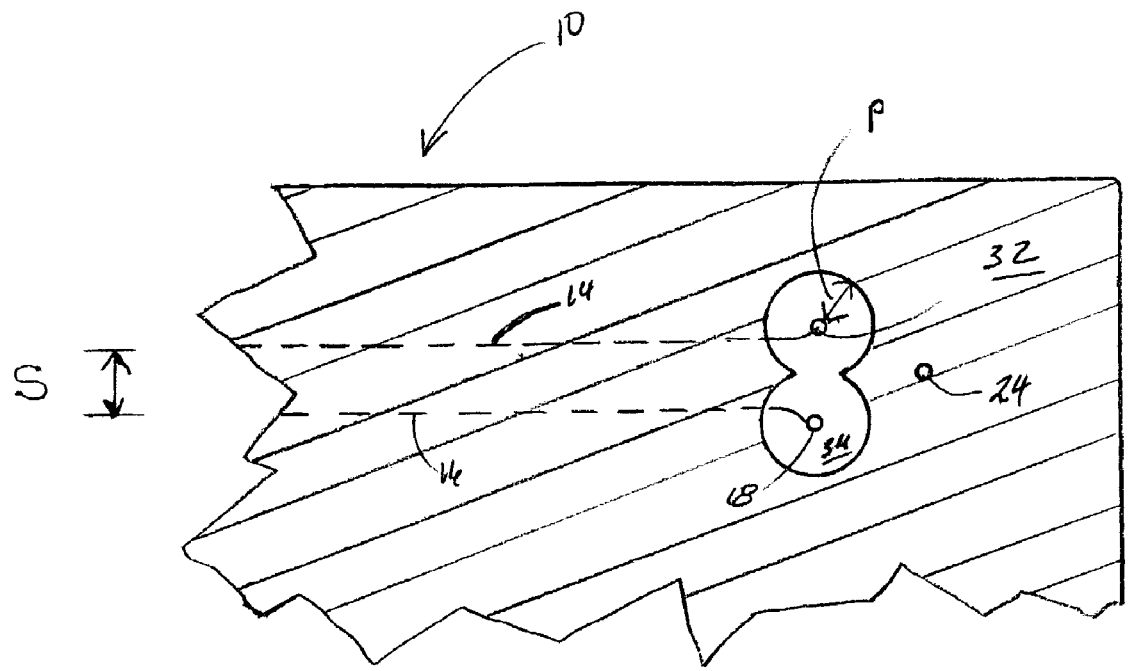
FIG. 5 is a top plan view of a portion of a printed wiring board having one embodiment of the invention.

FIG. 5 shows ground plane layer 32 in PWB 10. Signal traces 14 and 16 (shown in partial perspective as dashed lines) are in a different layer of PWB 10 and are in electrical contact with signal vias 18. A typical spacing S between signal traces 14 and 16 which comprise a differential pair signal trace is about 14 mils. A preferred radial spacing P between signal vias 18 and the surrounding ground conductor 32 in accordance with the present invention is from about 54 to about 66 mils. A particularly preferred radial spacing P is about 60 mils. As shown in FIG. 5, the unplated circular regions surrounding signal vias 14 and 16 may overlap one another so as to form a single 8-shaped unplated region 34.

Also shown in FIG. 5 is signal ground via 24. Ground via 24 comprises a plated through-hole, which, in some embodiments may fill with solder. It will be noted that, in the embodiment illustrated, ground via 24 is located approximately midway between linear extensions of signal traces 14 and 16. It will be appreciated by those skilled in the art that the spacing between signal traces 14 and 16 need not be the same as that between traces 20 on the exterior surface of PWB 10. In some embodiments, signal traces 14 and 16 may be curved rather than linear or incorporate curved segments so as to adjust the spacing between the traces to match that of the signal vias 18.

In the embodiment illustrated, signal vias 18 as well as ground via 24 are plated through-holes. In other embodiments, the signal vias and/or the ground via may be blind vias, buried vias, or any combination thereof In general, the signal ground via should be approximately the same length as that of the signal trace vias of the differential pair—i.e., the ground via should traverse the same number of layers and more preferably the very same layers of the PWB traversed by the signal vias. The ground via may be in electrical contact with one or more ground plane layers in the PWB. As illustrated in FIGS. 3 and 5, the ground via may be advantageously placed between linear extensions of signal lines 14 and 16 (as well as signal traces 20 and equidistant from signal vias 18 comprising the differential signal pair. It is preferable that the signal ground via not have a non-functional pad. Typical routing layer changes will minimize the stub length by changing the signal from upper signal layers to lower signal layers or vice versa. If the PCB thickness is 0.125 inch, the high speed differential pair traces routed through the PCB will have their impedance matched during the trace routing change from one layer to another.

The optimum location of ground via(s) 24 on PWB 10 may be determined empirically by time domain reflectometry to obtain the desired signal impedance and to match the impedances of the lines comprising the differential pair signal trace. Computer simulations may also be used to optimize the positioning of the ground via(s) in accordance with the present invention. As shown in FIG. 5, one particularly preferred configuration has been found to be equidistant spacing of the ground via and the two associated signal trace vias with the ground via being located on a line drawn midway between the two signal traces and on the side of the signal vias opposite to the interior-layer signal traces.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of decreasing the capacitance between a signal trace and a ground plane on a printed wiring board which signal trace traverses one or more layers of said printed wiring board by way of a via service terminal which comprises:

providing a first layout of the printed wiring board having a first radial spacing between the via service terminal and surrounding conductive regions of ground planes traversed by the via service terminal and having a first radial spacing between the via service terminal and surrounding conductive regions of power planes traversed by the via service terminal; and, providing a second layout of the printed wiring board having a second radial spacing between the via service terminal and surrounding conductive regions of ground planes traversed by the via service terminal and a second radial spacing between the via service terminal wherein each of said second radial spacings is greater than the corresponding first radial spacing.

2. A method as recited in claim 1 wherein the second radial spacing between the via service terminal and surrounding conductive regions of ground planes and power planes traversed by the via service terminal is about 60 mils.

3. A method as recited in claim 1 wherein the first radial spacing between the via service terminal and surrounding conductive regions of ground planes and power planes traversed by the via service terminal is about 32 mils and the second radial spacing between the via service terminal and surrounding conductive regions of ground planes and power planes traversed by the via service terminal is about 60 mils.

4. A method as recited in claim 1 wherein the magnitude of the first radial spacing between the via service terminal and surrounding conductive regions of ground planes and power planes traversed by the via service terminal is about one-half the magnitude of the second radial spacing between the via service terminal and surrounding conductive regions of ground planes and power planes traversed by the via service terminal.

5. A method for impedance matching two signal traces on a printed wiring board which traces traverse one or more layers of said printed wiring board by way of via service terminals which comprises:
provic a ground via service terminal at a location on the printed wiring board which improves the impedance match of the two signal traces; and,
routing the electrical current which comprises the signal return through said ground via service terminal.

6. A method as recited in claim 5 wherein the location of the ground via service terminal is approximately equidistant from and substantially parallel to the two signal trace via service terminals.

7. A method as recited in claim 6 wherein the location of the ground via service terminal is approximately the same distance from each signal trace via service terminal as the signal trace via service terminals are from each other.

8. A method as recited in claim 5 wherein the printed wiring board is a multilayer printed wiring board.

9. A method as recited in claim 8 wherein the signal traces are on interior layers of the printed wiring board and the via service terminals are blind vias.

10. A method as recited in claim 5 wherein the printed wiring board has a top surface and a bottom surface and signal traces which traverse the thickness of the printed wiring board from the top surface to the bottom surface by means of via service terminals.

11. A method as recited in claim 10 wherein the via service terminals are plated through-holes in the wiring board.

12. A method as recited in claim 5 wherein the signal traces are differential pair signal traces.

13. A method for impedance matching two signal traces on a printed wiring board which traces traverse one or more layers of said printed wiring board by way of via service terminals which comprises:
providing a ground via service terminal at a location on the printed wiring board which reduces the difference between the impedances of the two signal traces; and,
routing the electrical current which comprises the signal return through said ground via service terminal.

14. A method for impedance matching two signal traces on a printed wiring board which traces traverse one or more layers of said printed wiring board by way of via service terminals which comprises:
providing a plurality of ground via service terminals at locations on the wiring board which reduce the difference between the impedances of the two signal traces; and,
routing the electrical current which comprises the signal return through said ground via service terminals.

15. A method for reducing the difference in impedance between two signal traces on a printed wiring board which traces traverse one or more layers of said printed wiring board by way of via service terminals which comprises:
providing a ground via service terminal approximately equidistant from and substantially parallel to the signal trace via service terminals; and;
routing the electrical current which comprises the signal return through said ground via service terminal.

16. A method for impedance matching two signal traces on a printed wiring board which traces traverse one or more layers of said printed wiring board by way of via service terminals which comprises:
providing a ground via service terminal at a location on the printed wiring board which improves the impedance match of the two signal traces;
routing the electrical current which comprises the signal return through said ground via service terminal;
providing increased spacing between the via service terminal and surrounding conductive regions of ground planes traversed by the via service terminal; and,
providing increased spacing between the via service terminal and surrounding conductive regions of power planes traversed by the via service terminal.

17. A method as recited in claim 16 wherein providing increased spacing between the via service terminal and surrounding conductive regions of power planes and ground planes traversed by the via service terminal increases such spacing by about a factor of 2.

18. A method as recited in claim 16 wherein providing increased spacing between the via service terminal and surrounding conductive regions of power planes and ground planes traversed by the via service terminal increases such spacing to about 60 mils.

19. A method of fabricating a multiplayer printed wiling board comprising:
providing a voltage plane comprised of electrically conductive material on a first layer of the printed wiring board;
providing a signal trace on a second layer of the printed wiring board;
providing a signal trace on a third layer of the printed wiring board;
providing a via service terminal which electrically connects the signal trace on the second layer of the printed wiring board to the signal trace on the third layer of the printed wiring board and which traverses the first layer of the printed wiring board; and,
providing a radial clearance of about 60 mils from the via, service terminal to the electrically conductive material on the first layer of the printed wiring board.

* * * * *